United States Patent [19]
Guha et al.

[11] Patent Number: 5,231,048
[45] Date of Patent: Jul. 27, 1993

[54] MICROWAVE ENERGIZED DEPOSITION PROCESS WHEREIN THE DEPOSITION IS CARRIED OUT AT A PRESSURE LESS THAN THE PRESSURE OF THE MINIMUM POINT ON THE DEPOSITION SYSTEM'S PASCHEN CURVE

[75] Inventors: Subhendu Guha, Troy; Arindam Banerjee, Madison Heights; Chi C. Yang; XiXiang Xu, both of Troy, all of Mich.

[73] Assignee: United Solar Systems Corporation, Troy, Mich.

[21] Appl. No.: 811,608

[22] Filed: Dec. 23, 1991

[51] Int. Cl.$^5$ .................. H01L 21/00; H01L 21/02; H01L 21/326
[52] U.S. Cl. .................. 437/113; 437/101; 437/225; 437/228; 437/233; 427/575; 427/570; 118/723
[58] Field of Search ............ 437/113, 225, 228; 427/38, 39

[56] References Cited
U.S. PATENT DOCUMENTS

| | | | |
|---|---|---|---|
| 4,504,518 | 3/1985 | Ovshinsky et al. | 437/101 |
| 4,701,343 | 10/1987 | Ovshinsky et al. | 427/39 |
| 4,737,379 | 4/1988 | Hudgens et al. | 427/575 |
| 4,745,000 | 5/1988 | Ovshinsky et al. | 427/39 |
| 4,783,374 | 11/1988 | Custer et al. | 428/450 |
| 4,883,686 | 11/1989 | Doehler et al. | 427/38 |
| 4,893,584 | 1/1990 | Doehler et al. | 427/38 |
| 4,937,094 | 6/1990 | Doehler et al. | 427/574 |
| 5,093,149 | 3/1992 | Doehler et al. | 427/38 |

OTHER PUBLICATIONS

Wang, Effect of plasma pressure on the properties of a -Si:H, Philos. Mag., B., Mar. 1986, vol. 53(3), pp. 183-191.
Yang, Paschen curve and deposition kinetics in plasma process, Inter. Photovoltaic sci. and eng. conf., Tech. digest, Nov. 1984, pp. 723-725.

*Primary Examiner*—Brian E. Hearn
*Assistant Examiner*—B. Everhart
*Attorney, Agent, or Firm*—Krass & Young

[57] ABSTRACT

The glow discharge deposition of thin film materials is most advantageously carried out at a pressure which is less than the pressure of the minimum point on the deposition system's Paschen curve and at a power which is in excess of the minimum power required to sustain a deposition plasma at the particular process pressure.

10 Claims, 2 Drawing Sheets

MICROWAVE ENERGIZED DEPOSITION PROCESS WHEREIN THE DEPOSITION IS CARRIED OUT AT A PRESSURE LESS THAN THE PRESSURE OF THE MINIMUM POINT ON THE DEPOSITION SYSTEM'S PASCHEN CURVE

FIELD OF THE INVENTION

This invention relates generally to preparation of thin film materials. More specifically the invention relates to the glow discharge deposition of thin film materials; and more specifically, the invention relates to a microwave energerized glow discharge deposition process carried out in a particular pressure and power regime, which process is particularly well suited for the preparation of semiconductor materials.

BACKGROUND OF THE INVENTION

Glow discharge decomposition is employed for the preparation of thin films of a variety of materials such as semiconductor materials, insulating materials, optical coatings, polymers and the like. In a typical glow discharge deposition, a process gas which includes a precursor of the material being deposited, is introduced into a deposition chamber, typically at subatmospheric pressure. Electromagnetic energy, either AC or DC is introduced into the chamber and energizes the process gas so as to create an excited plasma therefrom. The plasma decomposes the precursor material and deposits a coating on a substrate maintained proximate the plasma region. Frequently the substrate is heated to facilitate growth of the deposit thereupon. This technology is well known in the art. Early glow discharge depositions employed either direct current, low frequency alternating current or radio frequency alternating current to energize the plasma; radio frequency current is still very widely employed for this purpose.

One particular drawback to glow discharge deposition processes was their relatively low speed and in an attempt to increase deposition rates those of skill in the art turned to the use of microwave energized plasmas. The earliest microwave energized depositions were carried out in pressure ranges typical of those employed for radio frequency energized deposits, that is to say, pressure ranges of approximately one torr. These depositions were generally not practical for semiconductor materials. While the rate of deposition was quite high, the materials produced thereby were distinctly inferior to those produced with radio frequency energy. The early prior art microwave deposited materials tended to include large numbers of polymeric inclusions and other deviant morphologies; hence, these materials typically were not suitable for use in electrical or optical devices.

In a second generation of microwave energized, glow discharge decomposition processes it was recognized that deposition gas pressures signficantly lower than those employed in radio frequency energized depositions should be employed. These second generation microwave deposition techniques are disclosed in U.S. Pat. Nos. 4,504,518; 4,517,223; 4,701,343 and 4,745,000, the disclosures of which are incorporated herein by reference. In determining the appropriate pressure conditions, the inventors named in the foregoing patents determined the Paschen curve for various glow discharge deposition processes and noted that the curve shifted to low pressures for depositions carried out with microwave energy. As is known to those of skill in the art the Paschen curve is determined by graphing the minimum voltage required to sustain a plasma of a particular process gas in a particular deposition apparatus at various pressures. It is to be noted that in some instances instead of voltage, the graph depicts the minimum power required to sustain a plasma and as such is referred to as a modified Paschen curve. In either instance, the term "Paschen curve" as used herein will refer to both types of graph. In a typical Paschen curve it will be noted that as pressure decreases the power or voltage required to sustain the plasma also decreases to a minimum after which the further decrease in the process gas pressure necessitates an increased power or voltage to sustain the plasma.

As detailed in the above referenced patents, it was the standard prior art practice to carry out depositions at a power-pressure point which approximated the minimum of the Paschen curve. Semiconductor materials prepared by depositions at or near the Paschen curve minimum manifest fairly good electrical and optical properties and can be prepared at relatively high deposition rates. In general though it has been found that materials prepared in a microwave plasma are not always of as high a quality as corresponding materials prepared by a radio frequency plasma, glow discharge deposition. For example, when silicon alloy materials prepared by prior art microwave deposition processes are incorporated into photovoltaic devices, the overall device efficiency decreases as compared to devices in which the alloy is prepared in a radio frequency plasma.

The present invention breaks with the prior art insofar as it recognizes that thin film materials of improved quality will be prepared if deposition conditions are changed to avoid the Paschen curve minimum. As will be described in further detail hereinbelow, it has specifically been found that the quality of semiconductor alloy materials is significantly improved if deposition is carried out at process pressures below the pressure of the minimum point on the Paschen curve and at a power which lies above the Paschen curve at that process pressure.

These and other advantages of the present invention will be readily apparent from the drawings, discussion and description which follow:

BRIEF DESCRIPTION OF THE INVENTION

Disclosed herein is a method for the microwave energized deposition of a body of semiconductor material. The method includes the steps of providing a deposition chamber having a conduit for introducing a preselected process gas thereinto and a source of a preselected frequency of microwave energy for activating the process gas so as to decompose the gas and form a plasma therefrom. The method includes the further steps of disposing a substrate in the chamber, introducing a process gas having a semiconductor precursor material therein into the chamber, maintaining the process gas at a process pressure which is less than the pressure at which a minimum power level of microwave energy of said preselected frequency will sustain a plasma of said process gas in the chamber and inputting microwave energy of said preselected frequency into the chamber at a power level in excess of the power level required to sustain a plasma of said process gas at the process pressure. The plasma thus created decomposes the process gas and deposits a layer of semiconductor material on the substrate. The pressure of a typical process is in the range of 1–30 millitorr and one preferred frequency of microwave energy is 2.45GHz. It is frequently desirable to maintain the substrate at an elevated temperature.

In a particular process for the preparation of a semiconductor device, the process gas includes a Group IV element such as silicon or germanium. The process gas may specifically include $SiH_4$, $Si_2H_6$, $GeH_4$, $SiF_4$, $GeF_4$ and combinations thereof. The process gas may also include a dopant element such as a Group III or a Group V element.

DETAILED DESCRIPTION OF THE INVENTION

In accord with the present invention it has been found that superior quality materials, particularly semiconductor materials are prepared in a microwave energized glow discharge decomposition process when the parameters of pressure and power are off the Paschen curve. Specifically it has been found that deposition process pressures are optimum if they are below pressures corresponding to the minimum of the Paschen curve and power is optimum when it is at a level higher than the minimum sustaining power at the particular process pressure. Materials prepared in this manner are particularly suited for use as the intrinsic layer of a p-i-n type photovoltaic device, although it is to be understood that the principles of the present invention also have applicability to the deposition of other thin film materials by microwave processes. This finding is counter-intuitive in view of prior art wisdom which taught that deposition should be carried out at the minimum point of the Paschen curve.

The advantages of the present invention are illustrated by an experimental series in which the microwave energized glow discharge decomposition of the intrinsic layer of a p-i-n type photovoltaic device was carried out under a variety of pressure and power conditions and with a variety of process gas mixtures to illustrate that superior cell performance is obtained from materials prepared in accord with the present invention.

Experimental

The photovoltaic devices prepared in this experimental series are of conventional p-i-n type design and basically comprise an electrically conductive stainless steel bottom electrode having a layer of n-type silicon alloy material deposited thereupon, a layer of intrinsic silicon alloy material thereatop and a layer of p-type silicon alloy material atop the layer of intrinsic semiconductor. The top electrode of the device is provided by a layer of transparent, conductive, metal oxide (TCO) material such as indium, tin or zinc oxide alone or in combination. The deposition was carried out in an apparatus generally similar to that of FIG. 4.

Figure 4:
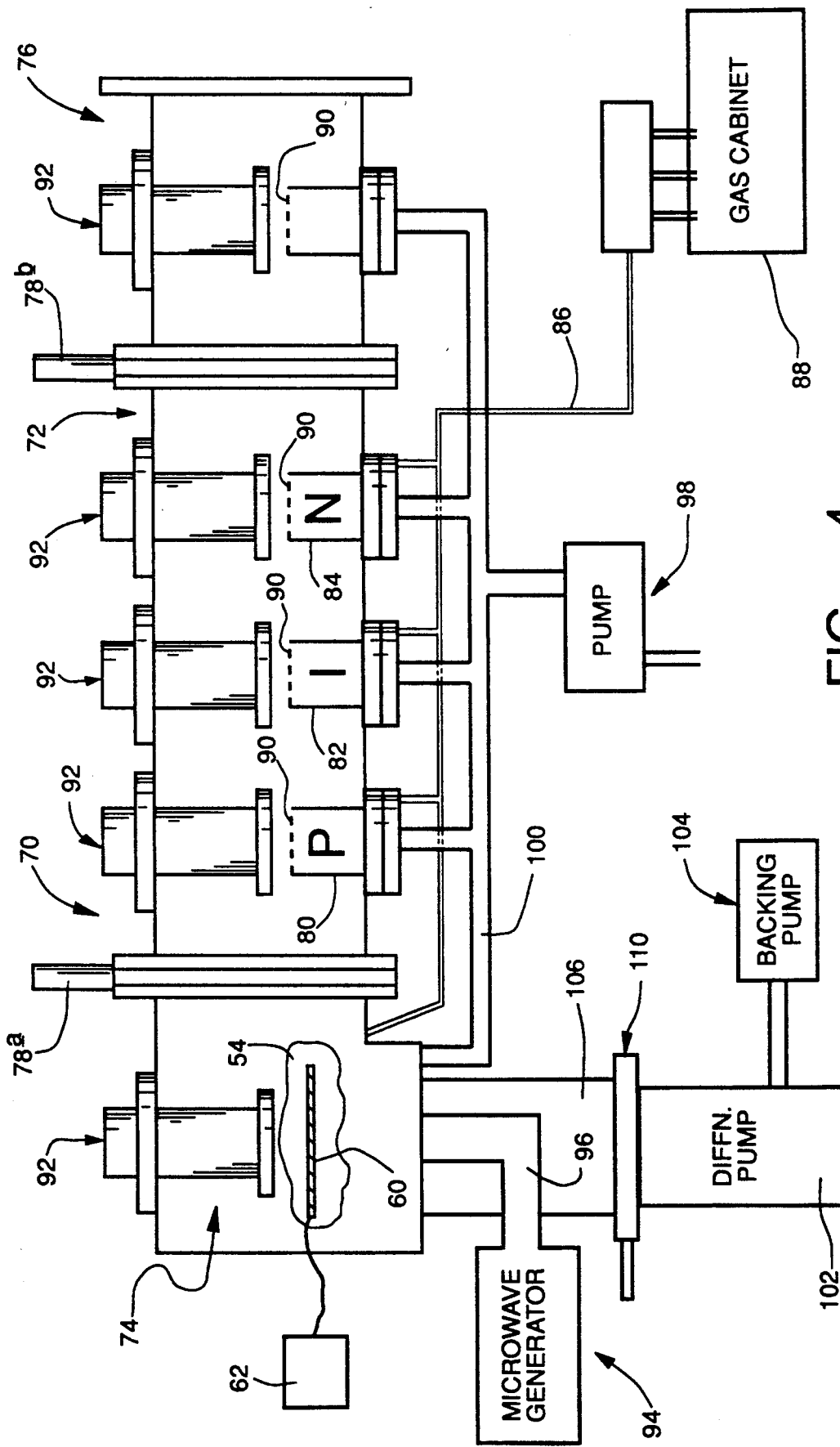
FIG. 4 is a schematic depiction of a particular deposition apparatus in which the foregoing depositions were conducted.

FIG. 4 depicts a plasma deposition apparatus 70 operative to deposit a plurality of semiconductor layers upon a substrate. The apparatus 70 is notable insofar as it includes a radio frequency energized deposition chamber 72 as well as a microwave energized deposition chamber 74. In this manner, the apparatus 70 may be used for preparation of semiconductor devices under a variety of conditions. The apparatus 70 further includes a loading chamber 76 for removal and replacement of substrates. Separating the R.F. chamber 72, microwave chamber 74 and loading chamber 76 are gate valves 78a, 78b; and as is well known to those of skill in the art, such valves may be readily opened and closed to allow passage of a fairly large substrate between adjoining chambers.

The R.F. chamber 72 includes three separate deposition regions 80, 82 and 84 adapted to deposit a p-type, intrinsic and n-type semiconductor layers respectively. Toward that end, each deposition region is provided with a gas supply via a manifolded conduit 86 communicating with a gas supply cabinet 88. Each R.F. deposition region 80, 82, 84 includes a cathode 90 which is energized by radio frequency energy via a power supply (not shown) Each R.F. deposition region 80, 82, 84 further includes a substrate holder and heater assembly 92 which retains and heats a deposition substrate. It will be noted that the loading chamber 76 also includes a substrate heater assembly 92 and further includes a cathode 90. The heater 92 and cathode 90 may be employed to pretreat the substrate, as for example by plasma cleaning, deposition of particular layers and the like as is well known in the art.

The microwave chamber 74 also includes a substrate heater assembly 92, but it will be noted that this chamber 74 includes no cathode assembly. Instead, the microwave chamber is supplied with microwave energy via a microwave generator 94 operatively communicating therewith by a waveguide 96 through a microwave transmissive window as is well known to those of skill in the art. It will also be noted that the microwave chamber 74 includes a bias wire 60 disposed in the plasma region thereof and in electrical communication with a power supply 62.

The apparatus 70 further includes a process pump 98 operatively communicating with the various chambers via a vacuum conduit 100. It will also be noted that the microwave chamber 74 includes a separate pumping system comprised of a diffusion pump 102 having a backing pump 104 associated therewith and operatively connected to the microwave chamber 74 by a conduit 106 and a gate valve 110.

The microwave deposition process typically employs a very high flow of process gas and operates in a pressure regime different from the R.F. energized deposition and hence the separate pumping system is typically employed to maintain the proper pressure under these dynamic conditions.

The apparatus 70 may be employed to manufacture a variety of configurations of semiconductor device. In a typical process, a substrate is placed into the loading chamber 76; the pressure therein is lowered and any pretreatment such as plasma cleaning is carried out. The gate valve 78b is then opened and the substrate transferred by a conveyor system (not shown) to either the R.F. or microwave deposition chambers. By employing the appropriate deposition stations in the R.F. chamber 72, various doped or intrinsic base layers may be placed on the substrate. By opening the gate valve 78a and conveying the substrate into the microwave deposition chamber 74, the deposition of semiconductor layers by microwave energy may be carried out.

EXAMPLE 1

Figure 1:
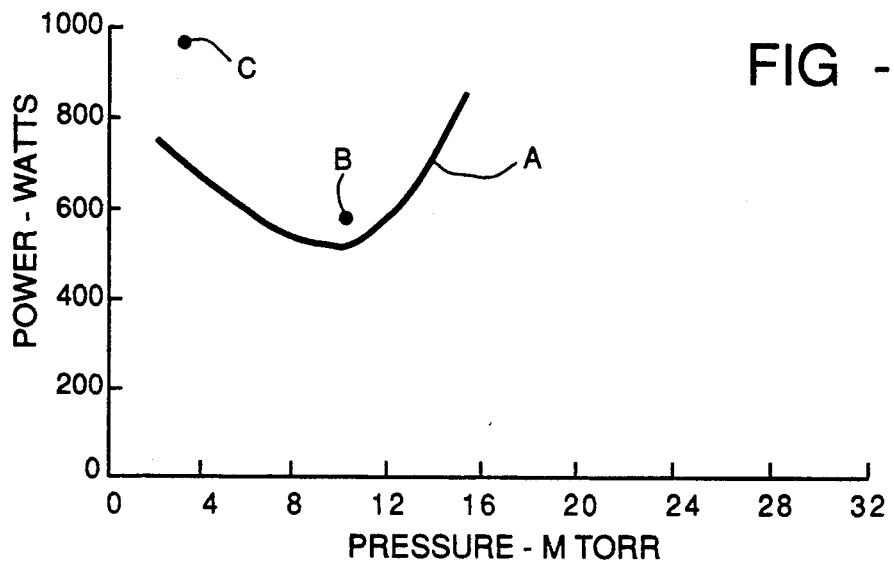
FIG. 1 depicts results of a first experimental series comprising the microwave energized glow discharge decomposition of a gas mixture including $SiH_4$ and $GeH_4$.

A deposition atmosphere of 30 sccm of $SiH_4$ and 17 sccm of $GeH_4$ was flowed through the microwave deposition chamber 74 of the FIG. 4 apparatus and the Paschen curve was determined by varying the gas pressure and microwave power to determine the minimum power required to sustain a plasma at a given pressure; curve A of FIG. 1 represents the Paschen curve for this mixture.

P-I-N type photovoltaic devices were prepared in accord with the following techniques. A stainless steel substrate was placed in the N region of the R.F. deposition chamber of an apparatus generally similar to that of FIG. 5. The apparatus was sealed and an atmosphere comprising 20 sccm of hydrogen, 0.75 sccm of a 1% mixture of phosphine in hydrogen and 0.65 sccm of disilane was flowed therethrough. The pump was adjusted to maintain a pressure of 1.2 torr in the chamber. The substrate heater was energized to maintain the substrate at a temperature of approximately 350° C. The gas mixture was energized with radio frequency energy of 13.56MHz. The cathode was approximately 3.5 inches in diameter and a power of 2 watts was applied thereto. The deposition conditions were maintained until approximately 200 angstroms of N-doped silicon alloy material was deposited on the substrate at which time cathode power was terminated.

The substrate, bearing the N-layer, was transferred to the microwave chamber and the gas gate thereto closed to seal the chamber from the remainder of the apparatus. An atmosphere of 30 sccm of silane and 17 sccm of $GeH_4$ was flowed through the chamber. The pump was adjusted to maintain a pressure of 10 millitorr in the chamber and the substrate was heated to 350° centigrade. Microwave energy of approximately 600 watts at 2.45 GHz was introduced into the chamber. These deposition conditions are shown at point B in FIG. 1 and are at the approximate minimum of the Paschen curve. The input of microwaves was maintained for 30 seconds and a layer of intrinsic semiconductor material of approximately 2,000–3,000 angstroms thickness was deposited. During this stage of the deposition a bias of approximately +20V was maintained on the bias wire.

After completion of the deposition of the intrinsic layer, the gate valve 78a was again opened and the coated substrate conveyed to the P region 80 of the R.F. deposition chamber 72. The chamber was sealed and an atmosphere of 95 sccm hydrogen 3.25 sccm of 2% mixture of $BF_3$ in hydrogen and 2.5 sccm of a 5% mixture of silane in hydrogen was flowed through the chamber. The pump was adjusted to maintain a pressure of 1.7 torr in the chamber and the substrate heater energized to maintain the substrate at a temperature of 175° C. The cathode was approximately 2.7 inches in diameter and was energized with 30 watts of radio frequency energy at 13.56MHz. These conditions provided for the deposition of a microcrystalline layer of p-doped silicon alloy material. The deposition was carried out for a sufficient length to deposit a 100 angstrom thick layer onto the intrinsic layer at which time the radio frequency energy was terminated and the system purged with argon. The thus completed photovoltaic device was removed from the apparatus and provided with a top electrode of a TCO material in a conventional vacuum evaporation process. The top electrode was approximately 650 angstroms thick.

The photovoltaic device thus produced was tested by measuring its efficiency under the illumination of an AM-1.5 solar spectrum. The efficiency of this device was approximately 0.8%.

A second deposition was carried out utilizing the same gas mixtures and the same basic techniques except that for the deposition of the intrinsic layer the pressure was maintained at 3 millitorr and the microwave power input was 950 watts. This power-pressure point is shown at C in FIG. 1 and is in accord with the present invention. The photovoltaic device thus prepared was also evaluated under an A.M.-1.5 solar simulator and the efficiency thereof was found to be approximately 5.5%.

EXAMPLE 2

Figure 2:
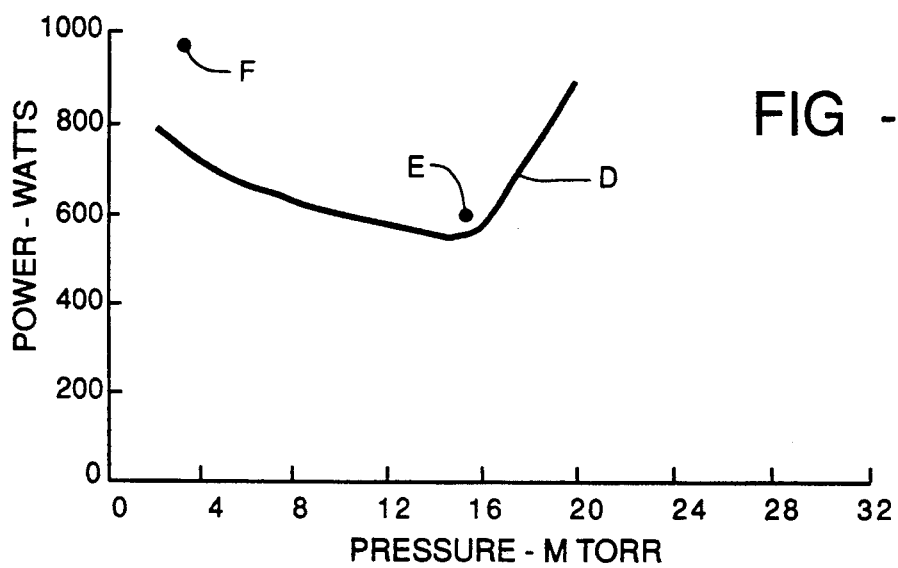
FIG. 2 depicts the results of a microwave energized glow disclosure decomposition of a gas mixture including $SiH_4$; $GeH_4$ and He.

A second experimental series was carried out utilizing an intrinsic process gas mixture comprised of 30 sccm $SiH_4$, 17 sccm $GeH_4$ and 30 sccm He. Again, the Paschen curve was determined by varying the pressure of the gas mixture in the deposition chamber and noting the minimum power required to sustain a plasma. This Paschen curve is illustrated in FIG. 2 at curve D.

Again, a series of photovoltaic devices were prepared in accord with the general procedure of the previous example. In a first instance, the intrinsic layer was deposited at a pressure of 15 millitorr and a power of 600 watts and these conditions are depicted by the point E on the FIG. 2 graph. These conditions are at the approximate minimum of the Paschen curve. The device thus prepared at an efficiency of 0.385% under an A.M. 1.5 solar spectrum.

A second device was prepared having an intrinsic layer which was deposited at a pressure of 3 millitorr and a power of 950 watts. These deposition conditions are depicted at point F of FIG. 2. The efficiency of the photovoltaic device thus prepared was approximately 6% under an A.M.-1.5 solar spectrum.

EXAMPLE 3

Figure 3:
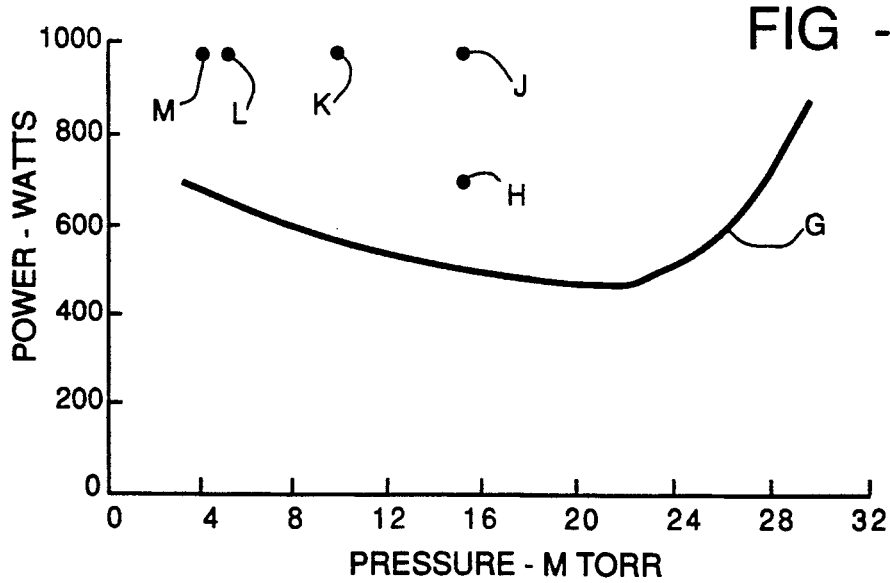
FIG. 3 depicts the results of the glow discharge decomposition of a process gas mixture including $SiH_4$; $GeH_4$; He and Ar.

A third experimental series was carried out in accord with the previous protocol employing a process gas comprised of 30 sccm $SiH_4$, 18 sccm $GeH_4$, 70 sccm He and 5 sccm Ar. The Paschen curve for this mixture was again determined by varying pressure and power as in the foregoing example and this curve is depicted in FIG. 3 as curve G.

A series of photovoltaic devices was prepared utilizing the gas mixture described hereinabove. The deposition was in accord with the previous procedures. The intrinsic layer of the first device was prepared at a pressure of 15 millitorr and a power of 700 watts. This point is depicted at H on the FIG. 3 graph and it approximates the minimum of the Paschen curve. Point H is at a somewhat higher pressure and power than the absolute minimum of curve G; however, in a practical sense there is always some scatter in the points used to determine the Paschen curve and this point is at most only slightly removed from the minimum. The efficiency of the device prepared under these conditions was found to be 0.6% under an A.M.-1.5 spectrum.

The intrinsic layer of the next photovoltaic device was prepared at a process gas pressure of 50 millitorr as in the previous example; however, the power input was raised to 950 watts. These deposition conditions are represented by Point J in FIG. 3. The efficiency of the device thus produced increased to 3.5% thereby illustrating the benefits attendant upon the use of the present invention.

Further photovoltaic devices were produced in which the intrinsic layer was deposited at progressively lower pressures. The third device included an intrinsic layer deposited at a pressure of 10 millitorr and a power of 950 watts as indicated by point K and this device had an efficiency of 4.6%. The intrinsic layer of the next device was prepared at a power of 950 watts and a pressure of 5 millitorr as shown by point L and the device efficiency was 5.3%. Yet another device was manufactured in which the intrinsic layer was prepared at a pressure of 3.9 millitorr and a power of 950 watts as indicated by Point M. The efficiency of this device was 5.4%.

It will thus be seen that the present invention marks a break with heretofore conventional wisdom which dictated that optimum microwave deposition conditions for thin film materials occur at or near the minimum of the Paschen curve. The present invention has recognized that improvement of the layers is attendant upon carrying out the deposition at process pressures below the pressure of the minimum point on the Paschen curve and at powers which are in excess of the minimum power required to sustain a plasma at that process pressure.

While the foregoing devices all included a Si-Ge alloy intrinsic layer, similar improvements are attained in photovoltaic devices employing silicon alloy intrinsic layers. Also, the present invention was found to be of value in preparing high quality alloy materials of silicon, and/or germanium and/or nitrogen and/or carbon and/or oxygen.

The particular shape and position of the Paschen curve will depend upon the geometry of the deposition chamber, the frequency of the electromagnetic energy employed and the particular gas mixture being decomposed. Hence the particular pressure-power regime required for optimum deposition will also depend upon the system and materials. In general though it has been found that for the microwave energized glow discharge deposition of Group IV semiconductor alloy materials, particularly silicon, germanium and silicon-germanium alloys, deposition pressures of 30 millitorr or less and preferably 15 millitorr or less and powers in the range of 800 to 1,000 watts are generally satisfactory for deposition on a substrate of approximately 2–4 inches in diameter. One particularly suitable pressure range is found to be that of approximately 3–5 millitorr at powers which are at least 50% in excess of the minimum power required to sustain the plasma at that pressure. The process of the present invention was described by way of examples detailing the fabrication of silicon-germanium alloy photovoltaic devices in a batch process. Clearly, the principles of the invention may be applied to the fabrication of a variety of other materials and devices by other microwave energized glow discharge processes. The present invention may also be practiced in a continuous deposition process wherein an elongated substrate is conveyed through a plurality of interconnected deposition regions. The invention may be utilized to fabricate a variety of materials as noted hereinabove and the superior electronic properties of materials prepared by the present invention makes it particularly well suited for the deposition of electronic materials such as semiconductors and insulators.

The invention is particularly applicable to the preparation of high quality alloys of silicon and one or more of: germanium, carbon, oxygen and nitrogen. The materials thus prepared may be employed in a variety of devices such as photovoltaic cells, diodes, thin film transistors, photoreceptors for xerography, photoconductive devices and the like. The invention may also be employed to deposit insulating layers and hard protective coatings.

In view of the foregoing it will be appreciated that the present invention identifies the fact that the microwave energized glow discharge deposition of thin film materials produces high quality deposits when the deposition process pressure is lower than the deposition pressure of the Paschen curve minimum and power levels are significantly above the minimum sustaining power at those process pressures. The particular pressure and power ranges are to some degree system dependent but may be readily determined in accord with the disclosure herein. The method may be applied to the preparation of a wide variety of thin film materials including optical materials, polymers, semiconductors, insulators and the like. The foregoing drawings, discussion and description are merely meant to be illustrative o particular embodiments of the invention and are not meant to be limitations upon the practice thereof. It is the following claims, including all equivalents, which define the scope of the invention.

We claim:

1. A method for the microwave energized deposition of a body of semiconductor material including the steps of:

providing a deposition chamber having associated therewith a conduit for introducing a preselected gas thereinto and a source of a preselected frequency of microwave energy for activating said process gas so as to decompose it and form a plasma therefrom;

disposing a substrate in said chamber;

introducing a process gas having a semiconductor element therein into said chamber;

maintaining the process gas at a process pressure which is less than the pressure at which a minimum power level of microwave energy of said preselected frequency will sustain a plasma of said process gas in said chamber;

inputting microwave energy of said preselected frequency into said chamber at a power level in excess of the power level required to sustain a plasma of said process gas at said process pressure in said chamber, whereby said microwave energy creates a plasma from the process gas which decomposes the semiconductor process gas and deposits a layer of semiconductor material on the substrate.

2. A method as in claim 1, wherein the step of maintaining the process gas at a process pressure comprises maintaining the process gas at a pressure of less than 30 millitorr.

3. A method as in claim 1, wherein the step of inputting microwave energy of said preselected frequency comprises inputting microwave energy having a frequency of 2.45 GHz.

4. A method as in claim 1, wherein the step of disposing the substrate in the chamber includes the further step of maintaining said substrate at an elevated temperature.

5. A method as in claim 4, wherein the step of maintaining the substrate at an elevated temperature comprises maintaining the substrate at a temperature in the range of 150°–400° C.

6. A method as in claim 1, wherein the step of introducing a process gas into the chamber comprises introducing a process gas including a Group IV element therein.

7. A method as in claim 1, wherein the step of introducing a process gas comprises introducing a process gas including a member selected from the group consisting of $SiH_4$; $Si_2H_6$; $GeH_4$, $SiF_4$, $GeF_4$, and combinations thereof.

8. A method as in claim 1, wherein the step of introducing a process gas comprises introducing a process gas including a dopant element therein.

9. A method as in claim 1, wherein the step of introducing a process gas comprises introducing a process gas including a member selected from the group consisting of silicon, germanium, carbon nitrogen and oxygen.

10. A method for the microwave energized deposition of a body of semiconductor material, said method including the steps of providing a deposition chamber having a conduit for introducing a preselected process gas thereinto and a source of a preselected frequency of microwave energy for activating said process gas so as to decompose said gas to form a plasma therefrom;

disposing a substrate in the chamber;

introducing a process gas having a semiconductor precursor therein into the chamber;

determining the Paschen curve for the decomposition of the process gas in the chamber by the preselected frequency of microwave energy;

maintaining said process gas at a process pressure which is less than the pressure of the minimum of the Paschen curve; and inputting microwave energy of said preselected frequency at a power level which is in excess of the minimum power required to sustain a plasma of said process gas at said process pressure so as to create a plasma from said process gas which decomposes said semiconductor precursor and deposits a layer of semiconductor material upon the substrate.

* * * * *